United States Patent
Kurozuka et al.

(10) Patent No.: US 7,538,471 B2
(45) Date of Patent: May 26, 2009

(54) MICROACTUATOR HAVING INCREASED RIGIDITY WITH REDUCED MASS

(75) Inventors: Akira Kurozuka, Fujiidera (JP);
Yoshihiro Mushika, Neyagawa (JP);
Osamu Kajino, Kadoma (JP)

(73) Assignee: Panasonic Corporation, Osaka (JP)

( * ) Notice: Subject to any disclaimer, the term of this patent is extended or adjusted under 35 U.S.C. 154(b) by 302 days.

(21) Appl. No.: 11/114,725

(22) Filed: Apr. 26, 2005

(65) Prior Publication Data

US 2005/0236928 A1     Oct. 27, 2005

(30) Foreign Application Priority Data

Apr. 26, 2004   (JP)   ............................ 2004-129281

(51) Int. Cl.
*H02N 1/00* (2006.01)
*G02B 26/08* (2006.01)

(52) U.S. Cl. .................... 310/309; 359/223; 359/291

(58) Field of Classification Search ................. 310/309; 359/223–226, 290, 291
See application file for complete search history.

(56) References Cited

U.S. PATENT DOCUMENTS

| | | | |
|---|---|---|---|
| 5,969,848 A * | 10/1999 | Lee et al. ..................... | 359/298 |
| 5,995,334 A | 11/1999 | Fan et al. | |
| 6,133,670 A | 10/2000 | Rodgers et al. | |
| 6,384,952 B1 * | 5/2002 | Clark et al. .................. | 359/224 |
| 6,445,107 B1 | 9/2002 | Jeong et al. ................. | 310/309 |
| 6,643,053 B2 * | 11/2003 | Li et al. ....................... | 359/290 |
| 6,706,202 B1 | 3/2004 | Sun et al. | |
| 6,778,305 B2 * | 8/2004 | Sniegowski et al. ......... | 359/224 |
| 6,900,922 B2 * | 5/2005 | Aubuchon ................... | 359/292 |
| 6,914,711 B2 * | 7/2005 | Novotny et al. ............. | 359/291 |
| 6,934,439 B2 * | 8/2005 | Mala et al. .................... | 385/18 |
| 2001/0030488 A1 | 10/2001 | Jerman et al. | |
| 2003/0053156 A1 * | 3/2003 | Satoh et al. .................. | 358/511 |
| 2005/0236928 A1 * | 10/2005 | Kurozuka et al. ........... | 310/309 |

FOREIGN PATENT DOCUMENTS

EP    1 020 984 A2    7/2000

(Continued)

OTHER PUBLICATIONS

Translation of JP 2000-147419, Izeki et al. "Light Deflector and Display using the Same", May 26, 2000.*

(Continued)

*Primary Examiner*—Karl I Tamai
(74) *Attorney, Agent, or Firm*—Panitch Schwarze Belisario & Nadel LLP

(57) ABSTRACT

There has been a trade-off between the rigidity and the mass of a movable section of a microactuator, and also between the rigidity of the movable section and the electrostatic force. A microactuator 100 includes: a base 1; a first comb electrode 2 supported by the base 1; a movable section 6 having a second comb electrode 8 opposing the first comb electrode 2, and at least one reinforcement rib 9 protruding toward the base 1; and an elastic supporting member 3 for supporting the movable section 6 so as to allow the movable section 6 to be displaced with respect to the base 1. The height of the second comb electrode 8 is different from the height of the at least one reinforcement rib 9.

13 Claims, 13 Drawing Sheets

FOREIGN PATENT DOCUMENTS

| | | | |
|---|---|---|---|
| JP | 10-148644 A | | 6/1998 |
| JP | 2000-147419 | * | 5/2000 |
| JP | 2000-147419 A | | 5/2000 |
| WO | 03/086954 | * | 10/2003 |

OTHER PUBLICATIONS

Shaw, K., et al., "SCREAM I: A single mask, single-crystal silicon, reactive ion etching process for microelectromechanical structures", *Sensors and Actuators A*, vol. 40, pp. 63-70 (Jan. 1994).

Ayazi, F., et al., "High Aspect-Ratio Combined Poly and Single-Crystal Silicon (HARPSS) MEMS Technology", *Journal of Microelectromechanical Systems*, vol. 9, No. 3, pp. 288-294 (Sep. 2000).

Selvakumar, A., et al., "Vertical Comb Array Microactuators", *Journal of Microelectromechanical Systems*, vol. 12, No. 4, pp. 440-449 (Aug. 2003).

* cited by examiner

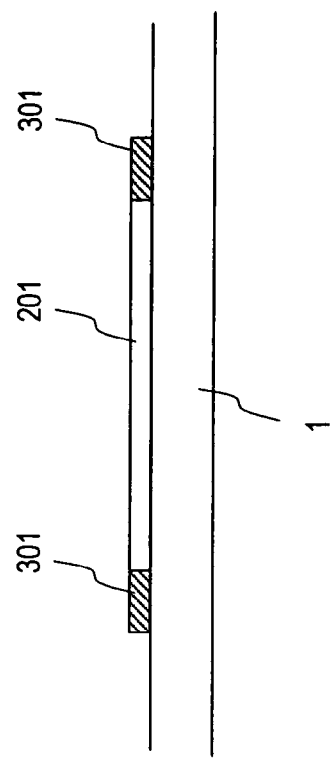
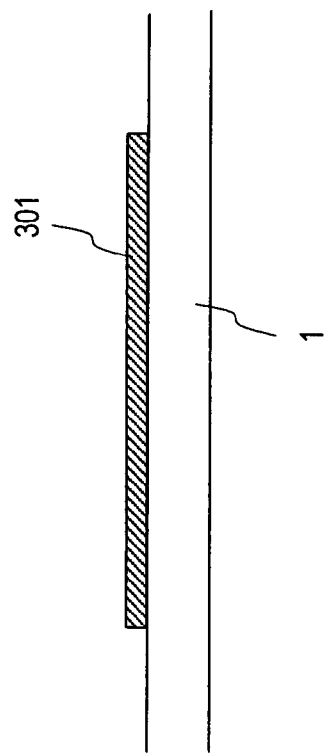

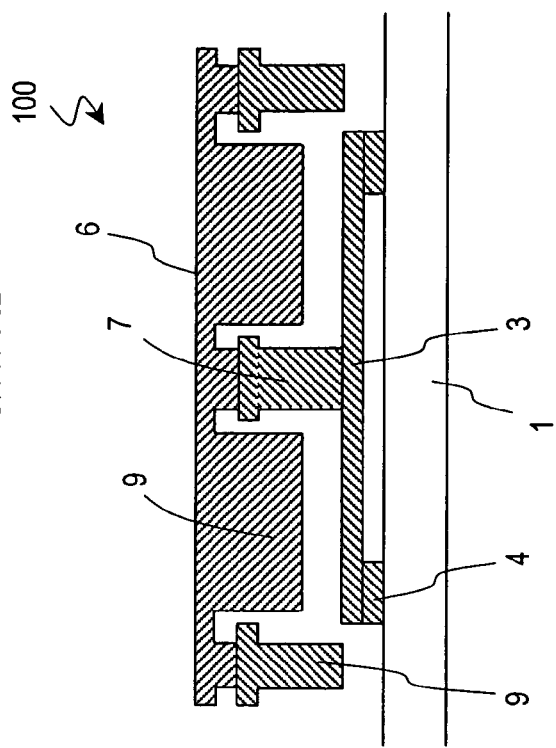
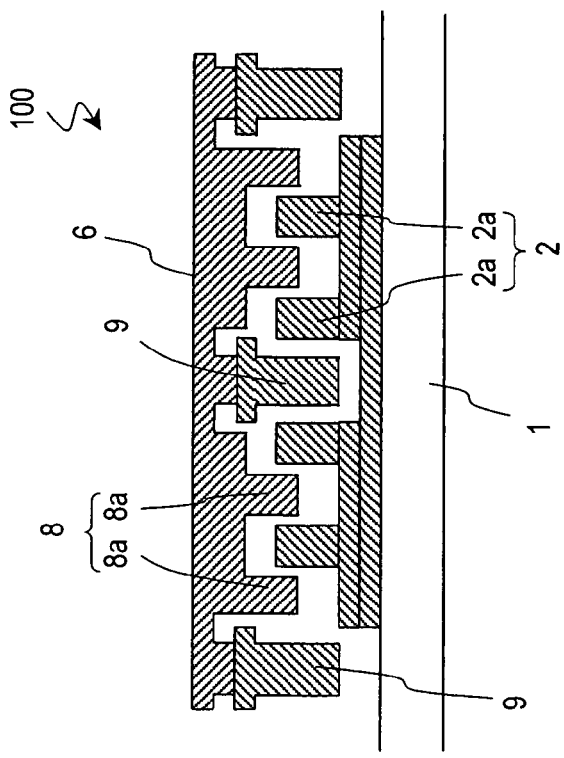

MICROACTUATOR HAVING INCREASED RIGIDITY WITH REDUCED MASS

BACKGROUND OF THE INVENTION

1. Field of the Invention

The present invention relates to a microactuator comprising comb electrodes for causing displacement of a movable section by means of electrostatic force. The microactuator of the present invention may be used as, for example, a micromirror device whose movable section includes a light reflecting surface.

2. Description of the Related Art

A microactuator, as one application of micromachining techniques, may be used as an optical scanning device as in a laser printer, a scanner, or a display, or as an optical switching device for switching light which goes into or out of an optical fiber, for example.

Japanese Laid-Open Patent Publication No. 2000-147419 discloses a microactuator comprising comb electrodes, which functions as an optical deflector. A movable section of this optical deflector includes a mirror surface functioning as a light reflecting surface. The movable section is supported by two beams which are provided along the same line. By utilizing an electrostatic force generated between a comb electrode which is provided on the movable section and a comb electrode which is provided on a base, the movable section is tilted, with the two beams serving as an axis of twist rotation. This optical deflector is simpler in construction than an optical deflector which rotates a polygon mirror by means of a motor, and can be formed by a semiconductor batch process. Thus, advantages such as ease of miniaturization and reduced fabrication cost are expected.

The comb electrode of the movable section of this optical deflector has protrusions functioning as comb teeth each of which extends in a direction perpendicular to the tilt axis, with grooves being formed in between protrusions. The comb electrode of the base also has protrusions functioning as comb teeth each of which extends in a direction perpendicular to the tilt axis, with grooves being formed in between protrusions. The comb teeth of the movable section and the comb teeth of the base oppose each other in an engaging fashion, with a gap being left therebetween. The movable section is reinforced by the comb teeth of the movable section protruding toward the base.

The above optical deflector is a mono-axial tilt mirror. In order to ensure that the gap between the comb teeth of the movable section and the comb teeth of the base does not change when the movable section is tilted, the comb teeth extend only in the direction perpendicular to the pivot axis.

However, the above optical deflector has the following problems.

In the above optical deflector, the comb teeth of the movable section extend only in the direction perpendicular to the tilt axis; that is, the movable section is not reinforced in any other direction. As a result, the movable section has a low rigidity. If the rigidity of the movable section is low, in the case where an Au film or a dielectric multilayer film is formed on the surface of the movable section in order to enhance the light reflectance, the movable section may be warped due to a difference between the coefficients of thermal expansion of the material of each such film and the material of the movable section, thus degrading the planarity of the light reflecting surface.

The rigidity of the movable section might be increased by increasing the height of the comb teeth. However, if the height of the comb teeth is made so high as to attain a necessary level of rigidity for the movable section, the mass of the movable section will also increase, thus requiring a greater driving force for driving the movable section. Moreover, the increased mass of the movable section also leads to a lower resonance frequency of the movable section, so that it becomes difficult to drive the movable section at a fast speed.

The movable section of the above microactuator only performs a mono-axial tilt. In another type of microactuator, comb teeth are provided so as to extend along a plurality of directions, thus enabling the movable section to be tilted in a multi-axial manner. Such a microactuator has the following problems. If the comb tooth height is increased in order to enhance the rigidity of the movable section, the comb teeth of the movable section and the comb teeth of the base may come in contact with each other when the movable section is tilted. If the gap between the comb teeth is increased in order to prevent such contact, the resultant electrostatic force will be decreased. If the comb tooth height is increased, the mass of the movable section will be increased, thus leading to the aforementioned problems of a large driving force being required and the inability to drive the movable section at a fast speed. Thus, there is a trade-off between the rigidity and the mass of the movable section, and also between the rigidity of the movable section and the electrostatic force.

SUMMARY OF THE INVENTION

In order to overcome the problems described above, preferred embodiments of the present invention provide a microactuator comprising a movable section which is capable of multi-axial tilting and which has a low mass and a high rigidity, such that the microactuator is capable of high-speed operation at a low voltage.

A microactuator according to the present invention comprises: a base; a first comb electrode supported by the base; a movable section having a second comb electrode opposing the first comb electrode, and at least one reinforcement rib protruding toward the base; and an elastic supporting member for supporting the movable section so as to allow the movable section to be displaced with respect to the base, wherein a height of the second comb electrode is different from a height of the at least one reinforcement rib.

In one embodiment, the height of the at least one reinforcement rib is greater than the height of the second comb electrode.

In one embodiment, the second comb electrode includes a plurality of comb teeth; and a thickness of the at least one reinforcement rib is greater than a thickness of each of the plurality of comb teeth.

In one embodiment, the second comb electrode includes a plurality of comb teeth; and the plurality of comb teeth extend in a direction from an inside to an outside of the movable section.

In one embodiment, the second comb electrode includes a plurality of comb teeth; and the plurality of comb teeth are shaped as concentric circles.

In one embodiment, the at least one reinforcement rib is provided at an outer periphery of the movable section.

In one embodiment, the second comb electrode includes a plurality of comb teeth; and the plurality of comb teeth and the at least one reinforcement rib extend in a same direction.

In one embodiment, the second comb electrode includes a plurality of comb teeth; and the plurality of comb teeth extend in a direction perpendicular to a direction in which the at least one reinforcement rib extends.

In one embodiment, the height of the second comb electrode reduces in a direction from an inside to an outside of the movable section.

In one embodiment, the second comb electrode includes a plurality of comb teeth; and each of the plurality of comb teeth has a thickness which reduces in a direction from an inside to an outside of the movable section.

In one embodiment, the elastic supporting member supports the movable section so as to allow the movable section to have a bi-axial tilt with respect to the base.

In one embodiment, the elastic supporting member supports the movable section so as to allow the movable section to be displaced along a vertical direction with respect to the base and have a bi-axial tilt with respect to the base.

In one embodiment, the movable section includes a light reflecting surface.

In accordance with the microactuator of the present invention, a movable section includes a reinforcement rib(s) for enhancing the rigidity of the movable section. By making the height of the reinforcement rib(s) greater than that of the comb electrodes, the rigidity of the movable section can be further enhanced. Since it is unnecessary to increase the comb tooth height for rigidity enhancement, the gaps along the horizontal direction between engaging comb teeth can be made narrow, and the mass of the movable section can be reduced. As a result, the movable section can be rapidly driven with a low voltage. Since the movable section has a high rigidity, in the case where the movable section has a light reflecting surface, the planarity of the light reflecting surface can be made very high.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 11A and 11B are schematic cross-sectional views illustrating a method for producing a microactuator according to Embodiment 5 of the present invention.

FIGS. 17A and 17B are schematic cross-sectional views illustrating a method for producing the microactuator according to Embodiment 5 of the present invention.

DETAILED DESCRIPTION OF PREFERRED EMBODIMENTS

Hereinafter, preferred embodiments of the present invention will be described with reference to the accompanying drawings.

Embodiment 1

With reference to FIGS. 1 to 6, a microactuator according to a first embodiment of the present invention will be described.

Figure 1:
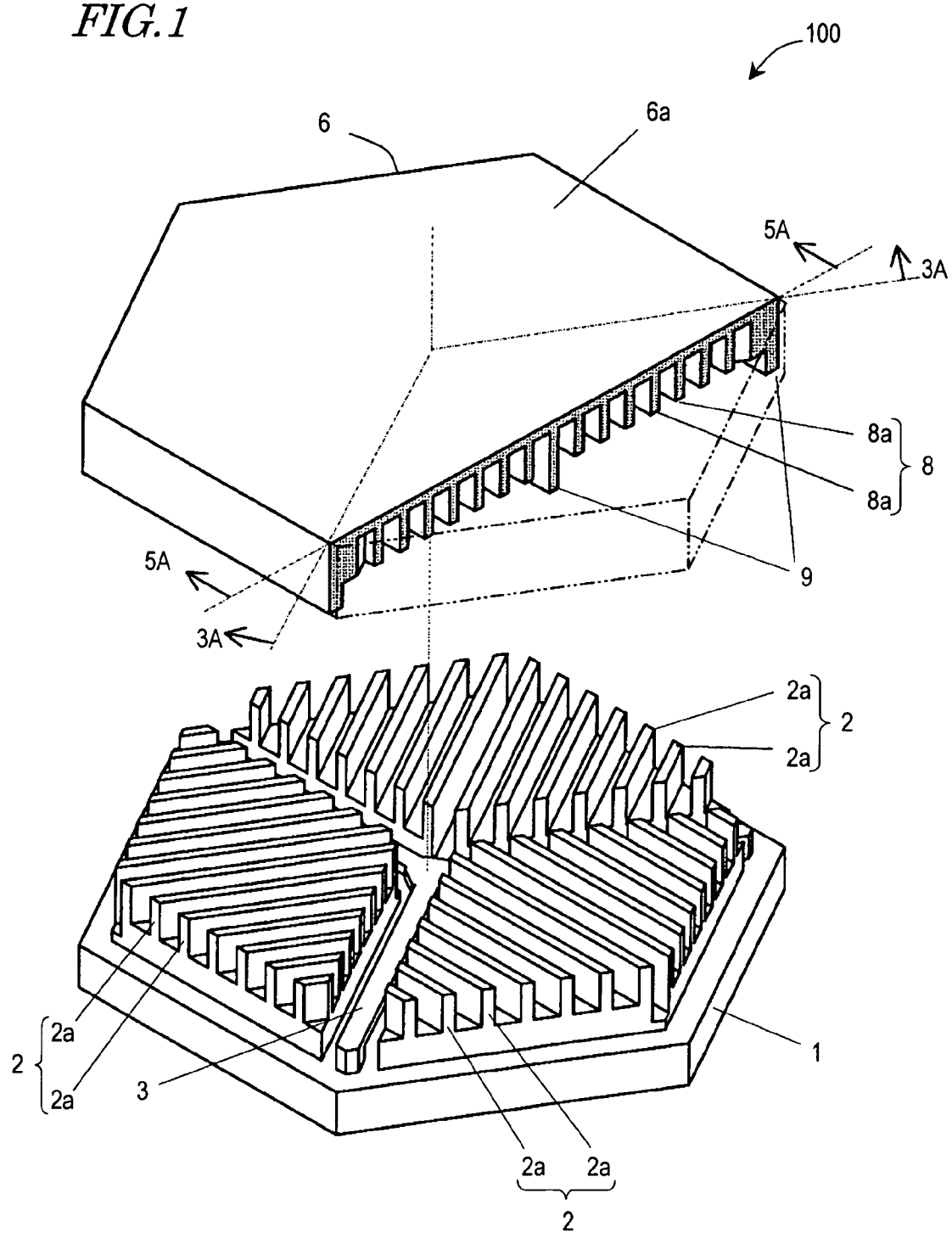
FIG. 1 is an exploded perspective view schematically showing a microactuator according to Embodiment 1 of the present invention.
Figure 2:
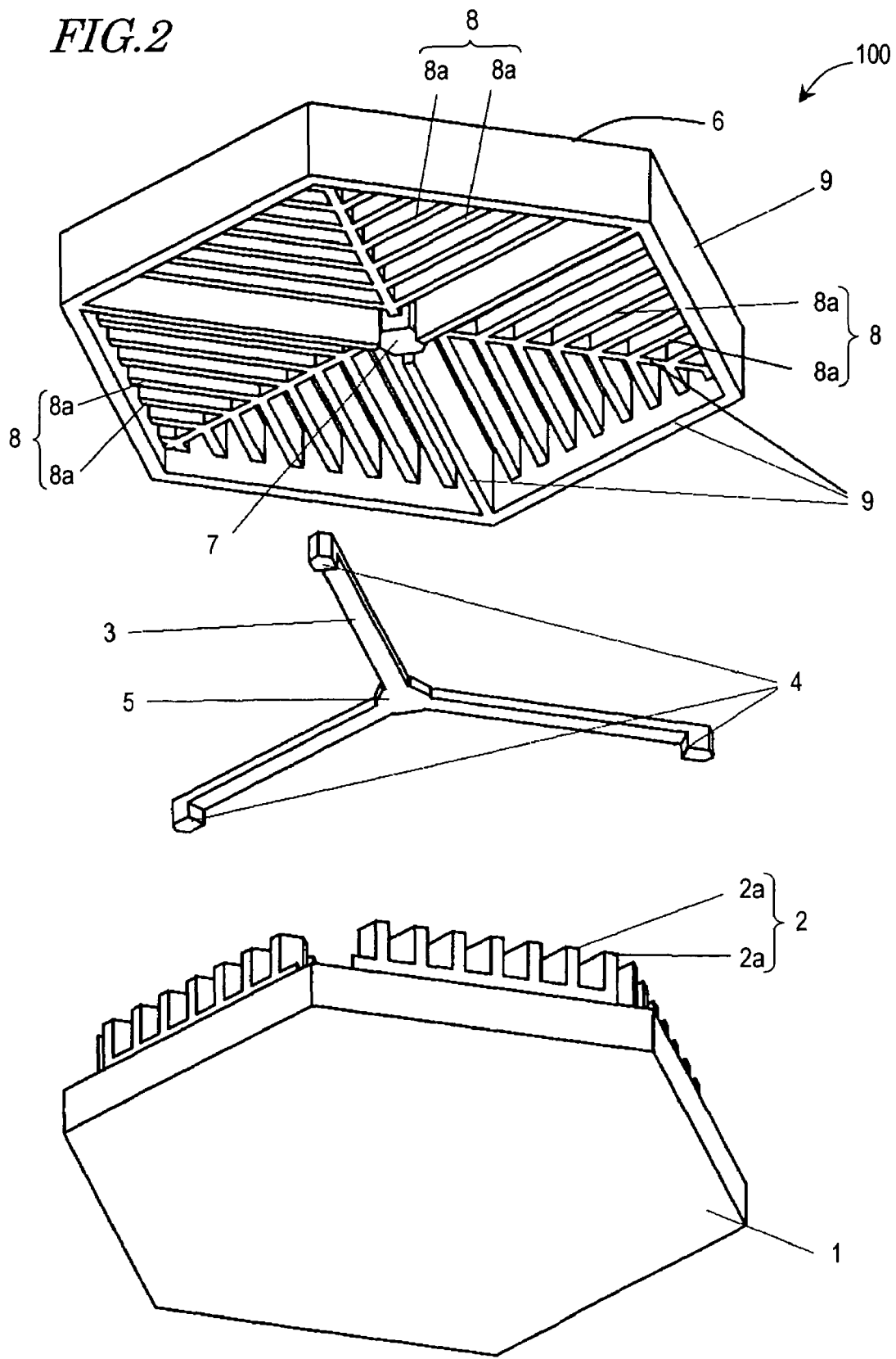
FIG. 2 is an exploded perspective view schematically showing the microactuator according to Embodiment 1 of the present invention.

Firstly, FIGS. 1 and 2 will be referred to, which are exploded perspective views schematically showing the microactuator 100 of the present embodiment. Specifically, FIG. 1 shows the microactuator 100 as viewed obliquely from above, whereas FIG. 2 shows the microactuator 100 as viewed obliquely from below. In FIG. 1, a portion of the movable section is cut away in order to show a rear cross-sectional view of the movable section. The microactuator 100 is produced by a micromachining technique employing a semiconductor process or a MEMS (Micro Electro Mechanical System) technique.

The microactuator 100 includes: a base 1; a plurality of first comb electrodes 2 supported by the base 1; a movable section 6; and an elastic supporting member 3 for supporting the movable section 6 in such a manner as to allow the movable section 6 to be displaced with respect to the base 1. The base 1 includes a drive circuit (not shown) for applying a voltage to each of the first comb electrodes 2, and an insulating layer (not shown) which is provided on the drive circuit. In a region (shaped as a regular hexagon) of the insulating layer of the base 1, a plurality of (e.g. three in the present embodiment) first comb electrodes 2 and an elastic supporting member 3 are provided. The first comb electrodes 2 function as static electrodes. Each first comb electrode 2 includes a plurality of first comb teeth 2a. Each of the first comb teeth 2a extends in a direction from the inside to outside of the regular hexagonal region.

The elastic supporting member 3 includes three support posts 4 which are located at the outer periphery side of the regular hexagon region of the base 1, and a fixture portion 5 which is located in the center of the regular hexagonal region. The fixture portion 5 affixes the elastic supporting member 3 to the movable section 6. A beam extends from each support post 4 to the fixture portion 5, such that the beams and the fixture portion 5 float off the base 1 at a predetermined distance. By the fixture portion 5 being jointed to the center post 7 of the movable section 6, the elastic supporting member 3 and the movable section 6 are affixed to each other. The elastic supporting member 3 supports the movable section 6 in such a manner that the movable section 6 is capable of displacement in a vertical direction with respect to the base 1, and a bi-axial tilt with respect to the base 1.

The movable section 6 has a hexagonal planar shape. The planar shape and size of the movable section 6 can be accorded to various designs depending on the purposes for which the microactuator 100 is used and the required performance thereof. In the present embodiment, the movable section 6 has a width of about 100 ($\mu$m). The movable section 6 has a light reflecting surface 6a and a plurality of (e.g. three in the present embodiment) second comb electrodes 8. The second comb electrodes 8 are provided on the face of the movable section 6 facing the base 1, whereas the light reflecting surface 6a is provided on an opposite face from the face of the movable section 6 facing the base 1. The second comb electrodes 8 function as movable electrodes. Each second comb electrode 8 opposes a corresponding one of the first comb electrodes 2. Each second comb electrode 8 includes a plurality of second comb teeth 8a. Each of the second comb teeth 8a extends in a direction from the inside to outside of the movable section 6. Each first comb tooth 2a and the corresponding second comb tooth 8a oppose each other in an engaging fashion, with a gap being left therebetween.

The movable section 6 includes at least one reinforcement rib 9 protruding toward the base 1 from the face of the movable section 6 facing the base 1. The reinforcement ribs 9 reinforce the movable section 6, thus increasing the rigidity of the movable section 6. In the present embodiment, the movable section 6 includes a plurality of reinforcement ribs 9. Some reinforcement ribs 9 are provided at the outer periphery of the movable section 6, whereas other reinforcement ribs 9 radially extend from the central portion of the movable section 6 to the vertices of the hexagon. Among the latter (radial) reinforcement ribs 9, there are three reinforcement ribs 9 each of which extends through a corresponding one of the second comb electrodes 8 and extends along the same direction as the second comb teeth 8a of that second comb electrode 8.

Among the reinforcement ribs 9, there are three radial reinforcement ribs 9 located above the elastic supporting member 3, which have the same height as that of the second comb electrodes 8 and are located at a predetermined interspace from the elastic supporting member 3. All the other reinforcement ribs 9 have a different height from that of the second comb electrode 8. Specifically, each reinforcement rib 9 which extends through a corresponding one of the second comb electrodes 8 and extends along the same direction as the second comb teeth 8a of the second comb electrode 8 has a height which is greater than the height of the second comb electrodes 8 (i.e., the height of the second comb teeth 8a). The reinforcement ribs 9 which are provided at the outer periphery of the movable section 6 also have a height which is greater than the height of the second comb electrodes 8. The height of the aforementioned reinforcement ribs 9 may be about 1.5 to 2 times as high as the height of the second comb electrodes 8, for example. The height of the first and second comb teeth 2a and 8a may be, for example, about 10 to 20 ($\mu$m), whereas the height of the aforementioned reinforcement ribs 9 may be about 15 to 40 ($\mu$m), for example. The relatively greater height of such reinforcement ribs 9 over the height of the second comb electrodes 8 makes for an increased rigidity of the movable section 6.

To each of the three first comb electrodes 2, a driving voltage is independently applied from the drive circuit. The elastic supporting member 3 is connected to ground via the drive circuit, whereas the movable section 6 is connected to ground via the elastic supporting member 3. When a driving voltage is applied to one of the first comb electrodes 2, the movable section 6 is drawn toward the base 1 due to an electrostatic force acting between the first comb electrode 2 and the corresponding second comb electrode 8. In accordance with the displacement of the movable section 6 relative to the base 1, a restoring force and restoring torque are generated in the elastic supporting member 5. The movable section 6 undergoes a displacement in the vertical direction with respect to the base 1 and/or a bi-axial tilt with respect to the base 1 so that the restoring force and restoring torque are at equilibrium with the electrostatic force.

Figure 3:
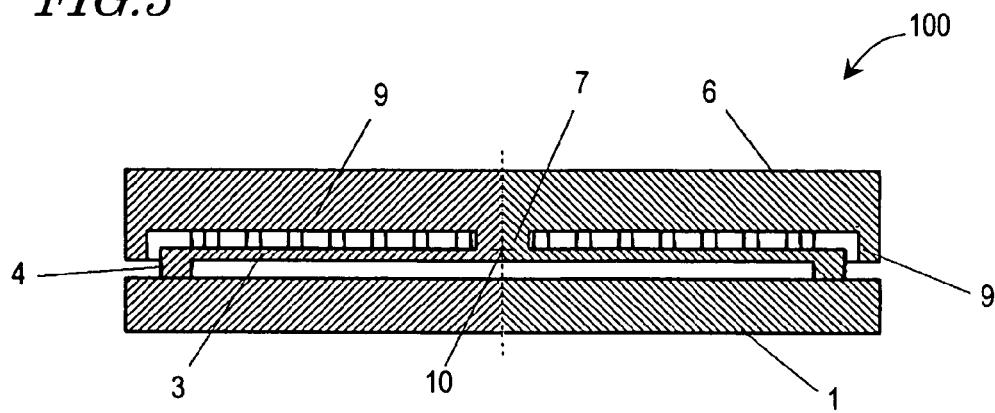
FIG. 3 is a cross-sectional view showing the microactuator of FIG. 1, taken along line 3A-3A.

FIG. 3 is a cross-sectional view showing the microactuator 100, taken along line 3A-3A in FIG. 1 (i.e., showing a cross section along the beams of the elastic supporting member 3, through the center of the microactuator 100).

Between the base 1 and the elastic supporting member 3, an interspace is provided for securing a desired displacement range of the movable section 6. Similarly, between the elastic supporting member 3 and those reinforcement ribs 9 which are located above the elastic supporting member 3, an interspace is provided for securing a desired displacement range of the movable section 6. The movable section 6 is tilted around a pivot center 10, which is located at the joint between the elastic supporting member 3 and the center post 7.

Figure 4A:
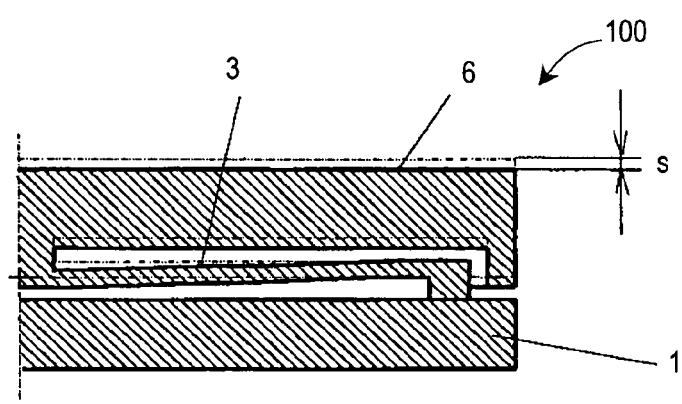
FIGS. 4A and 4B are partial cross-sectional views showing the microactuator of FIG. 1, taken along line 3A-3A, where the movable section has been displaced.
Figure 4B:
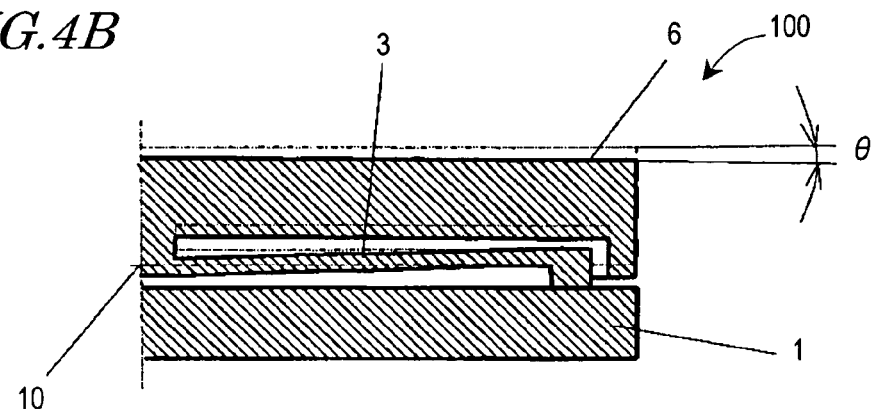

FIGS. 4A and 4B are partial cross-sectional views of the microactuator 100, taken along line 3A-3A in FIG. 1, where the movable section 6 has been displaced.

FIG. 4A illustrates a state where the same voltage is applied to all first comb electrodes 2 to cause the movable section 6 to translate in the lower direction by a maximum distance s. Due to the electrostatic force acting between the first and second comb electrodes 2 and 8, the movable section 6 is pulled down, thus flexing the elastic supporting member 3.

FIG. 4B illustrates a state where different voltages are applied to different first comb electrodes 2 to cause the movable section 6 to be tilted by a maximum angle $\theta$. The interspaces between the component elements are prescribed so that adequate interspace is left even where the most downward displacement occurs due to the tilt.

Naturally, once the application of the driving voltage is stopped, the movable section 6 resumes the original position and posture due to the elastic restoring force and restoring torque of the elastic supporting member 3.

In order to form the first and second comb electrodes 2 and 8 and the reinforcement ribs 9, a plasma etching technique called DRIE (Deep Reactive Ion Etching) may be employed, for example. By using DRIE, grooves are formed in the base 1, and structural portions and sacrificial layers are further deposited in the grooves, whereby the respective component elements are formed. Note that grooves which are formed by DRIE have a width dependence such that the groove depth increases as the groove width increases. Therefore, by performing a patterning so that the reinforcement ribs 9 have a broader width than that of the second comb electrodes 8, it can be ensured that the reinforcement ribs 9 have a greater height than that of the second comb electrodes 8. This also provides an additional advantage in that the rigidity of the movable section 6 is further enhanced because of the reinforcement ribs 9 having a greater thickness than the thickness of each second comb tooth 8a. The thickness of the first and second comb teeth 2a and 8a may be, e.g., about 1.0 to 3.0 (μm), while the thickness of the reinforcement ribs 9 may be, e.g., about 2.0 to 5.0 (μm).

Figure 5:
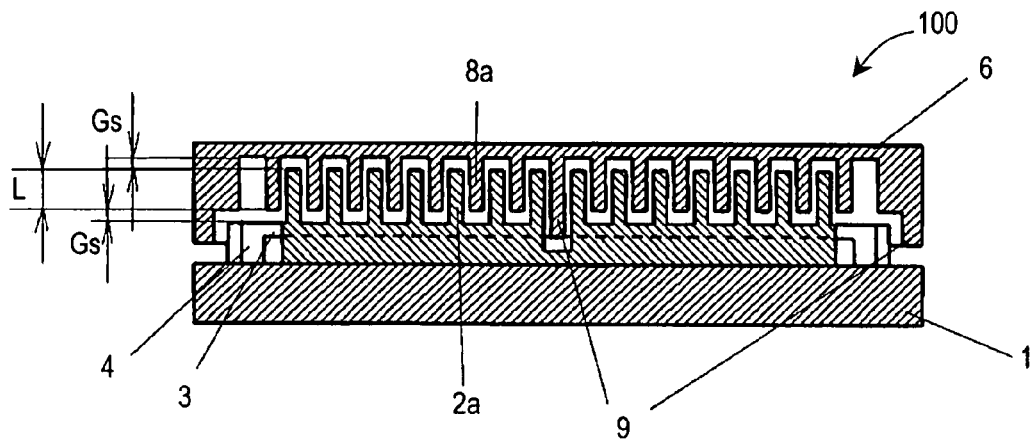
FIG. 5 is a cross-sectional view showing the microactuator of FIG. 1, taken along line 5A-5A.

FIG. 5 is a cross-sectional view of the microactuator 100, taken along line 5A-5A in FIG. 1, showing engagement between a first comb electrode 2 and a second comb electrode 8.

The distance Gs (along the height direction) between the tip of each first comb tooth 2a and the foot of an adjacent second comb tooth 8a is longer than the length of the stroke of the movable section 6. Similarly, the distance Gs (along the height direction) between the tip of each second comb tooth 8a and the foot of an adjacent first comb tooth 2a is longer than the length of the stroke of the movable section 6. The distance Gs corresponds to the height of the interspace in the neighborhood of the tip of each of the first and second comb teeth 2a and 8a. The distance Gs may be, e.g., about 3.0 to 10 (μm). The first comb teeth 2a and the second comb teeth 8a engage each other with an overlap of length L. The length L may be, e.g., about 10 to 20 (μm). The height (Gs+L) of each first or second comb tooth 2a or 8a is prescribed to be a minimum required height as determined in accordance with the length of the stroke of the movable section 6 and the required electrostatic force. On the other hand, the height of the reinforcement ribs 9 is prescribed to be greater than that of the first and second comb teeth 2a and 8a, thus increasing the rigidity of the movable section 6. Since the rigidity of the movable section 6 is increased by the reinforcement ribs 9, the height of the first and second comb teeth 2a and 8a can be kept at the minimum required height, and the thickness of the light reflecting surface 6a of the movable section 6 can be reduced. As a result, the mass of the movable section 6 can be greatly reduced while securing the necessary rigidity of the movable section 6. For example, the mass of the movable section 6 comprising the reinforcement ribs 9 can be made about 2 to 5 times lighter than the mass of a movable section which lacks the reinforcement ribs 9 but has the same level of rigidity (i.e., a movable section whose light reflecting surface 6a has a so much greater thickness and/or the second comb teeth 8a have a so much greater height). In some cases, an Au film or a dielectric multilayer film may be formed on the light reflecting surface 6a in order to enhance the reflectance of the light reflecting surface 6a; in such cases, even if the second comb electrodes 8 alone could not provide a sufficient rigidity for the movable section 6, the reinforcement ribs 9 can enhance the rigidity of the movable section 6, so that a light reflecting surface 6a having good planarity is obtained. Note that one of the grooves in the first comb electrode 2 opposes the reinforcement rib 9 which extends through the second comb electrode 8; the depth of this groove is correspondingly increased in accordance with the height of the reinforcement rib 9, thus ensuring that the interspace height in the neighborhood of the tip of the reinforcement rib 9 is equal to the interspace height in the neighborhood of the tip of each second comb tooth 8a.

Figure 6A:
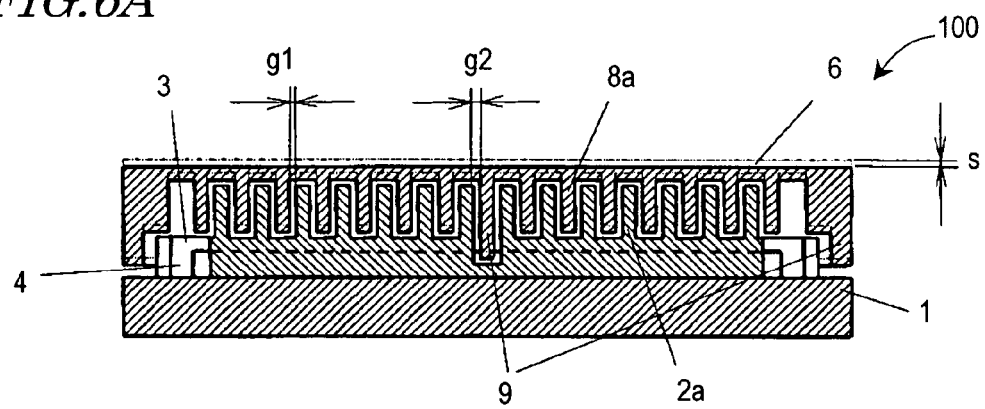
FIGS. 6A and 6B are cross-sectional views showing the microactuator of FIG. 1, taken along line 5A-5A, where the movable section has been displaced.
Figure 6B:
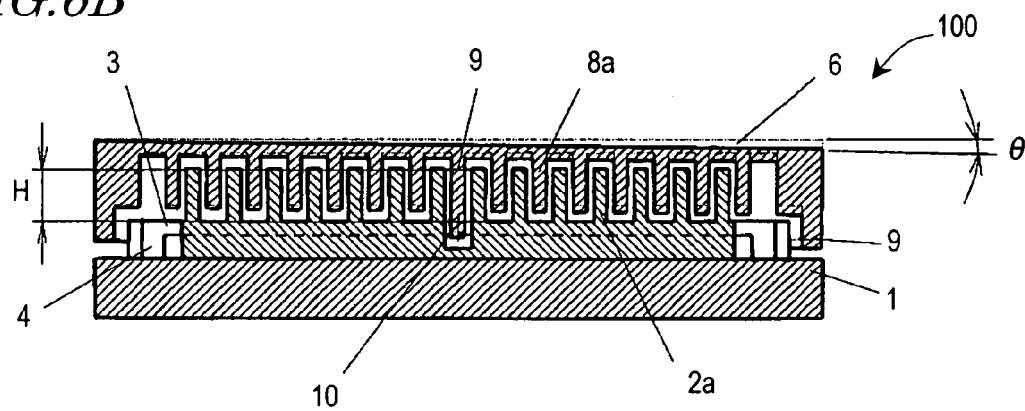

FIGS. 6A and 6B are cross-sectional views of the microactuator 100, taken along line 5A-5A in FIG. 1, where the movable section 6 has been displaced.

FIG. 6A illustrates a state where the same voltage is applied to all first comb electrodes 2 so as to cause the movable section 6 to translate in the lower direction by the maximum distance s. Since the movable section 6 does not make any movement in the horizontal direction, there is no interference between the first comb teeth 2a and the second comb teeth 8a. The gap between each first comb tooth 2a and an adjacent second comb tooth 8a along the horizontal direction is denoted as g1, whereas the gap between the reinforcement rib 9 which extends through the second comb electrode 8 and an adjacent first comb tooth 2a is denoted as g2.

FIG. 6B illustrates a state where different voltages are applied to different first comb electrodes 2 to cause the movable section 6 to be tilted by the maximum angle θ. In this case, the movable section 6 is tilted around the pivot center 10. At a distance H (i.e., at a tip height of each first comb tooth 2a) from the pivot center 10, the second comb electrode 8 moves by a maximum of Hθ along the horizontal direction (note that the distance H is substantially equal to the height (Gs+L) of each first or second comb tooth 2a or 8a). In the microactuator 100, the height (Gs+L) is prescribed to be the minimum required height, and therefore Hθ can also be kept minimum. Generally, increasing the gap g1 between comb teeth along the horizontal direction in order to avoid interference between comb teeth results in a decrease in the electrostatic force. According to the present invention, there is an advantage in that the height (Gs+L) is kept minimum, whereby g1 can also be kept small. The gap g2 between the reinforcement rib 9 which extends through the second comb electrode 8 and an adjacent first comb tooth 2a may also be equivalent to g1, and thus there is no interference between the reinforcement rib 9 and the first comb electrode 2, either.

Thus, by differentiating the height of the second comb electrodes 8 (which generate electrostatic force) from the height of some of the reinforcement ribs 9 (which enhance the rigidity of the movable section 6), the rigidity of the movable section 6 can be increased to a necessary and sufficient level, without sacrificing the driving force. As a result, a movable section 6 which has a low mass and a high rigidity and which provides a light reflecting surface with good planarity can be obtained.

Embodiment 2

Figure 7:
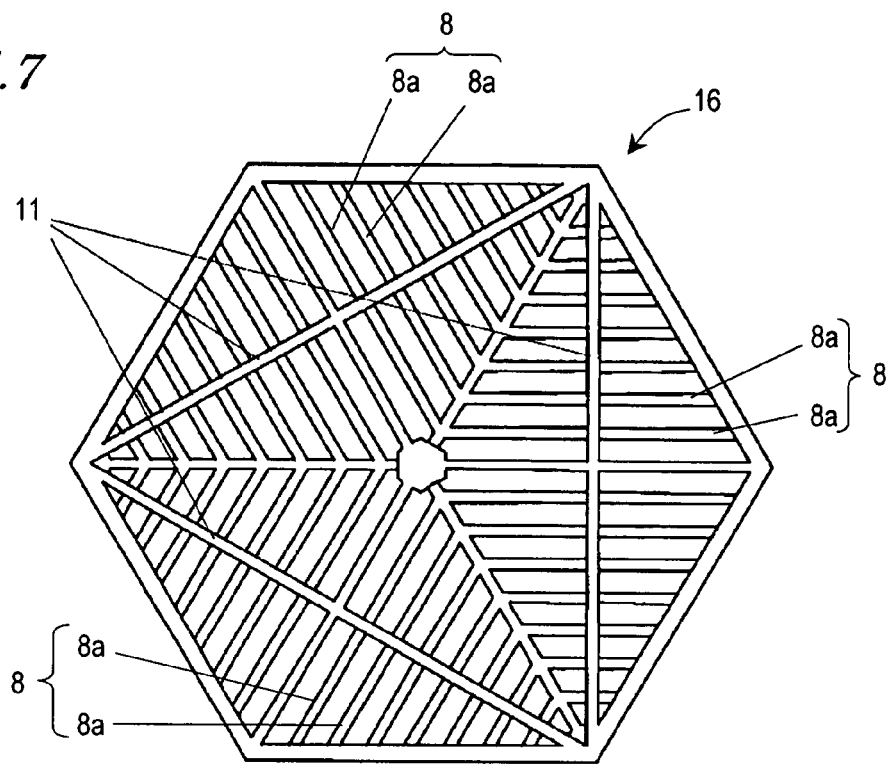
FIG. 7 is a plan view schematically showing a movable section of a microactuator according to Embodiment 2 of the present invention.

Referring to FIG. 7, a microactuator according to a second embodiment of the present invention will be described.

FIG. 7 is a plan view schematically showing a movable section 16 according to the present embodiment. In the present embodiment, the microactuator 100 comprises the movable section 16, instead of the movable section 6.

In addition to the component elements employed in the movable section 6 of Embodiment 1, the movable section 16 additionally comprises at least one reinforcement rib 11 (a plurality of such reinforcement ribs 11 are illustrated in the present embodiment). Each reinforcement rib 11 extends through a corresponding one of the second comb electrodes 8, and extends along a direction perpendicular to the direction in which the second comb teeth 8a of that second comb electrode 8 extend. Each reinforcement rib 11 has the same height as that of those reinforcement rib 9 whose height is greater than that of the second comb teeth 8a. In the present embodiment, grooves (not shown) corresponding to the reinforcement ribs 11 are to be formed in the first comb electrodes 2. The distance between the reinforcement ribs 11 and the first comb electrodes 2 is set in a manner similar to the distance between the reinforcement ribs 9 and the first comb electrodes 2. Due to the addition of the reinforcement ribs 11 in the movable section 16, the movable section 16 has an even higher rigidity than that of the movable section 6.

Embodiment 3

Figure 8:
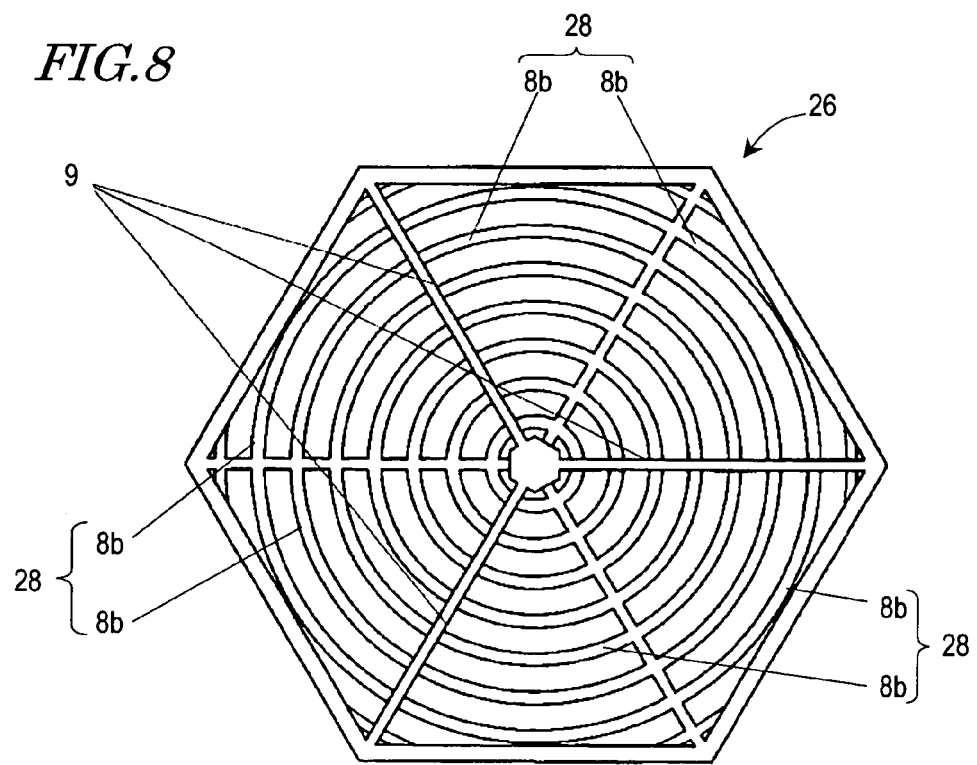
FIG. 8 is a plan view schematically showing a movable section of a microactuator according to Embodiment 3 of the present invention.

Referring to FIG. 8, a microactuator according to a third embodiment of the present invention will be described.

FIG. 8 is a plan view schematically showing a movable section 26 according to the present embodiment. In the present embodiment, the microactuator 100 comprises the movable section 26, instead of the movable section 6.

Instead of the second comb electrodes 8 in the movable section 6 of Embodiment 1, the movable section 26 includes a plurality of second comb electrodes 28. Each second comb electrode 28 includes a plurality of second comb teeth 8b in the form of concentric circles. In the present embodiment, the first comb teeth 2a are also shaped as concentric circles (not shown), correspondingly to the second comb teeth 8b. The second comb teeth 8b, each of which lies perpendicular to the radially-extending reinforcement ribs 9, enhances the rigidity of the movable section 26. Since the positional relationship between the first comb electrodes 2 and the second comb electrodes 28 is maintained the same irrespective of the tilt direction of the movable section 26, a well-balanced driving force can be obtained.

Furthermore, any pulling force along the horizontal direction which may occur due to diversifications among the gaps between the first comb teeth 2a and the second comb teeth 8b always acts in a radius direction. Thus, there is a further advantage in that, since the elastic supporting member 3 supporting the movable section 26 radially extends and has a high rigidity in any radius direction, the second comb electrodes 28 are prevented from being pulled along the horizontal direction to come in contact with the first comb electrodes 2.

Embodiment 4

Figure 9:
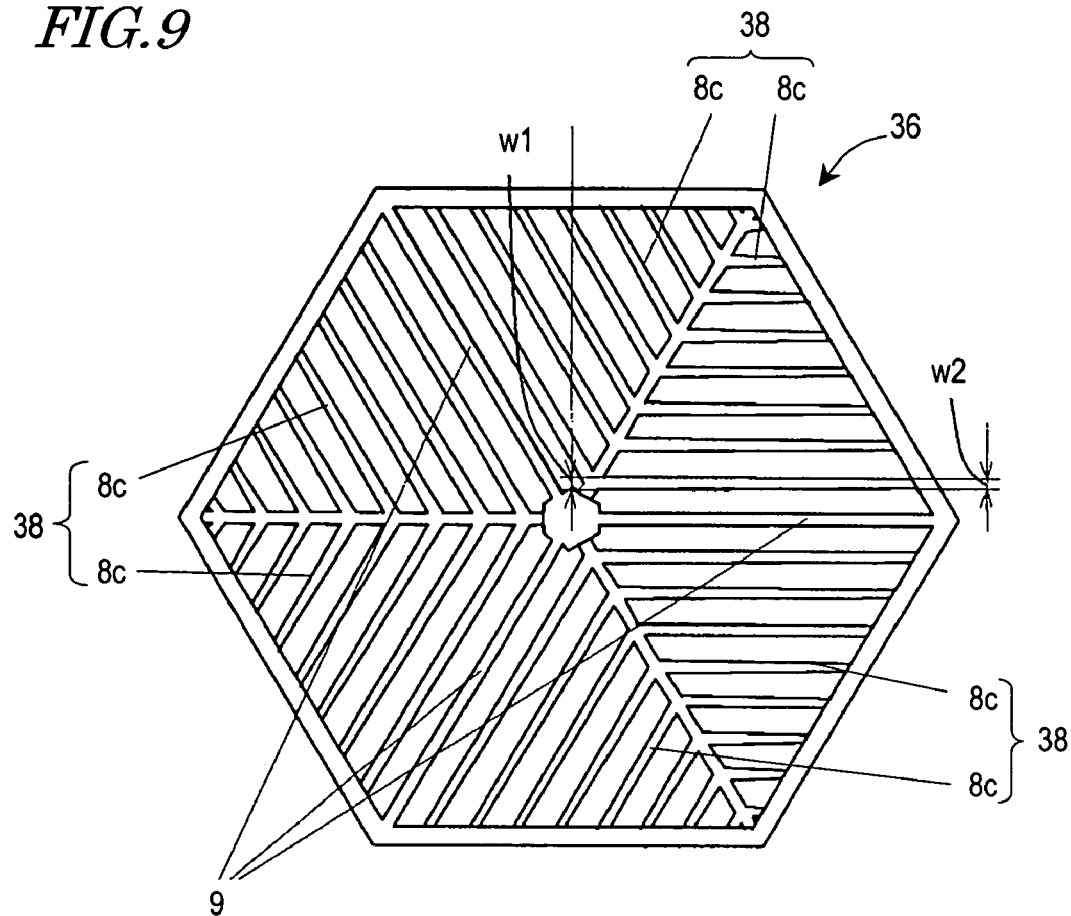
FIG. 9 is a plan view schematically showing a movable section of a microactuator according to Embodiment 4 of the present invention.
Figure 10:
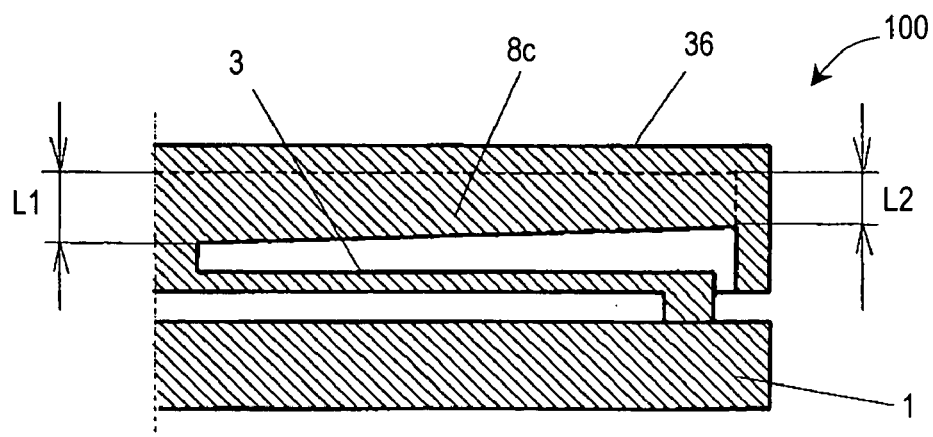
FIG. 10 is a partial cross-sectional view schematically showing a comb tooth of the microactuator according to Embodiment 4 of the present invention.

Referring to FIGS. 9 and 10, a microactuator according to a fourth embodiment of the present invention will be described.

First, reference is made to FIG. 9, which is a plan view schematically showing a movable section 36 according to the present embodiment. In the present embodiment, the microactuator 100 comprises the movable section 36, instead of the movable section 6.

Instead of the second comb electrodes 8 in the movable section 6 of Embodiment 1, the movable section 36 includes a plurality of second comb electrodes 38. Each second comb electrode 38 includes a plurality of second comb teeth 8c. The thickness of each second comb tooth 8c is reduced in a direction from the inside to the outside of the movable section 36. In other words, the width of each second comb tooth 8c changes from a width w1 near the center of the movable section 36 to a width w2 at the outer periphery, w2 being smaller than w1. In the present embodiment, each first comb tooth 2a also has a thickness which is increased (not shown) in a direction from the inside to the outside of the movable section 36, correspondingly to the shape of each second comb tooth 8c, whereby the gap between each first comb tooth 2a and an adjacent second comb tooth 8c along the horizontal direction is maintained constant. As a result, the movable section 36 can be made even lighter than the movable section 6, without degrading the rigidity of the movable section 36.

FIG. 10 shows a cross-sectional shape of a second comb tooth 8c. The height of the second comb tooth 8c becomes lower in a direction from the inside to the outside of the movable section 36. (In the case where the first comb electrodes 2 and the second comb electrodes 38 are formed by DRIE, the height of each second comb tooth 8c becomes lower as its width becomes narrower, due to the width dependence associated with DRIE.) In such second comb teeth 8c, the height of each second comb tooth 8c changes from a height L1 at the inner periphery side to a height L2 at the outer periphery side, L2 being smaller than L1. With this shape, an extra interspace is provided near the outer periphery side of each second comb tooth 8c, so that, even when the second comb teeth 8c are lowered due to a tilt of the movable section 36, contact between the second comb teeth 8c and the elastic supporting member 3 can be prevented, whereby a more reliable microactuator can be obtained.

Embodiment 5

Referring to FIGS. 11A and 11B to FIGS. 17A and 17B, an embodiment of a method of producing the microactuator 100 of the present invention will be described. FIGS. 11A and 11B to FIGS. 17A and 17B are cross-sectional views schematically illustrating an embodiment of a method of producing the microactuator 100 of the present invention. FIGS. 11A, 12A, 13A, 14A, 15A, 16A, and 17A each show a cross section of the microactuator 100 along line 5A-5A in FIG. 1, whereas FIGS. 11B, 12B, 13B, 14B, 15B, 16B, and 17B each show a cross section of the microactuator 100 along line 3A-3A in FIG. 1. For simplicity of explanation, in the present embodiment, fewer first and second comb teeth 2a and 8a are illustrated than in FIG. 1. Note that the numbers of first and second comb teeth 2a and 8a may be arbitrary. All production steps are to be conducted at a temperature lower than 450° C., which is a common withstand temperature of the drive circuit (CMOS circuits and the like) carried by the base 1.

First, FIGS. 11A and 11B are referred to. On the base 1, a first conductive layer 301 is formed. The first conductive layer 301 is formed in a desired shape by using a technique such as sputtering, photolithography, etching, or the like. The material of the first conductive layer 301 is aluminum, for example. The thickness of the first conductive layer 301 is about 0.5 to 1.0 (µm), for example. The material of the first conductive layer 301 may be polysilicon; in this case, the first conductive layer 301 is to be formed by using an LPCVD (Low Pressure Chemical Vapor Deposition) technique. The first conductive layer 301 is to become the root of a first comb electrode 2 and the support posts 4 of the elastic supporting member 3.

Next, by using a photolithography technique, a first sacrificial layer 201 is formed on the base 1. The material of the first sacrificial layer 201 is, for example, a photo-sensitive organic material such as a photoresist or photo-sensitive polyimide. More preferably, the material of the first sacrificial layer 201 is a high viscosity type material which can provide a high aspect shape (e.g. SU-8 and SU-10 (both of which are trade names) available from MicroChem Inc.). The first sacrificial layer 201 is provided in order to form an interspace under the elastic supporting member 3 in a subsequently-described step.

Figure 12A:
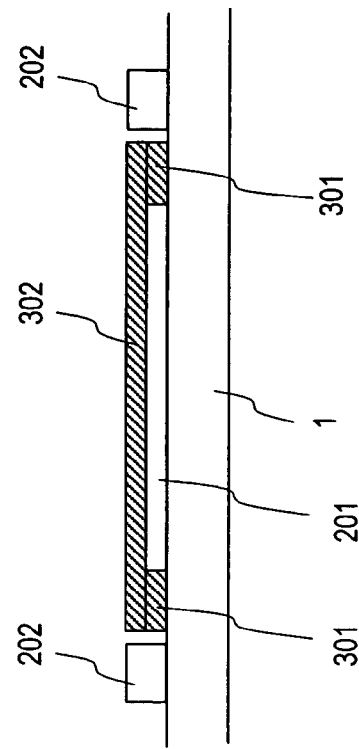
FIGS. 12A and 12B are schematic cross-sectional views illustrating a method for producing the microactuator according to Embodiment 5 of the present invention.
Figure 12B:
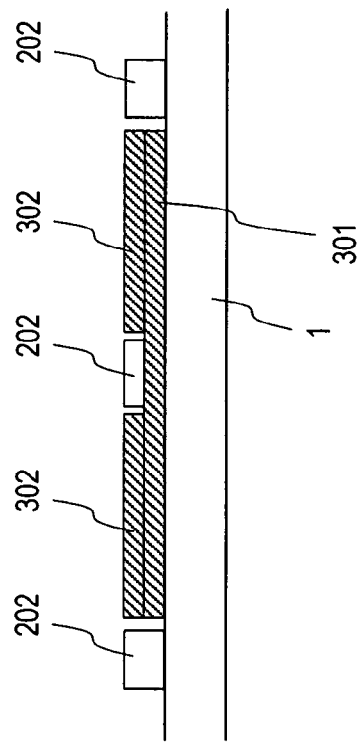

Next, FIGS. 12A and 12B are referred to. By using a low temperature sputtering technique, a second conductive layer 302 is formed on the first conductive layer 301 and the first sacrificial layer 201. The material of the second conductive layer 302 is the same material (e.g. aluminum) as that of the first conductive layer 301. The thickness of the second conductive layer 302 is about 0.5 to 2.0 (µm), for example. The second conductive layer 302 is to become the root of the first comb electrode 2 and the support posts 4 and beams of the elastic supporting member 3.

Next, by using a photolithography technique, a second sacrificial layer 202 is formed on the base 1 and the first conductive layer 301. The material of the second sacrificial layer 202 is the same material as that of the first sacrificial layer 201. The second sacrificial layer 202 is provided in order to form interspaces under the reinforcement ribs 9 in a subsequently-described step.

Figure 13A:
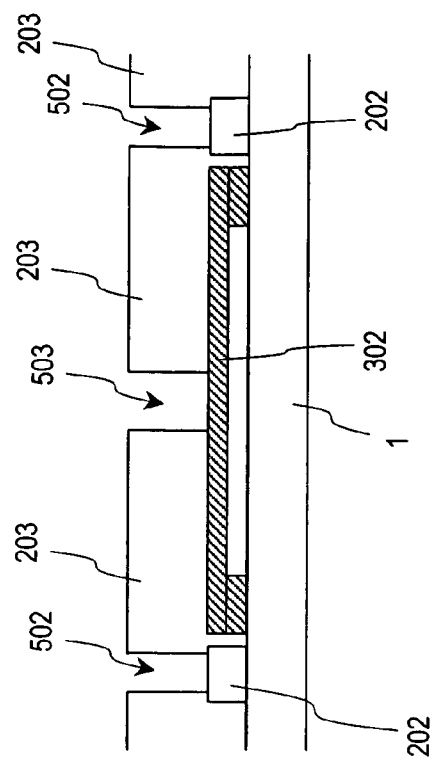
FIGS. 13A and 13B are schematic cross-sectional views illustrating a method for producing the microactuator according to Embodiment 5 of the present invention.
Figure 13B:
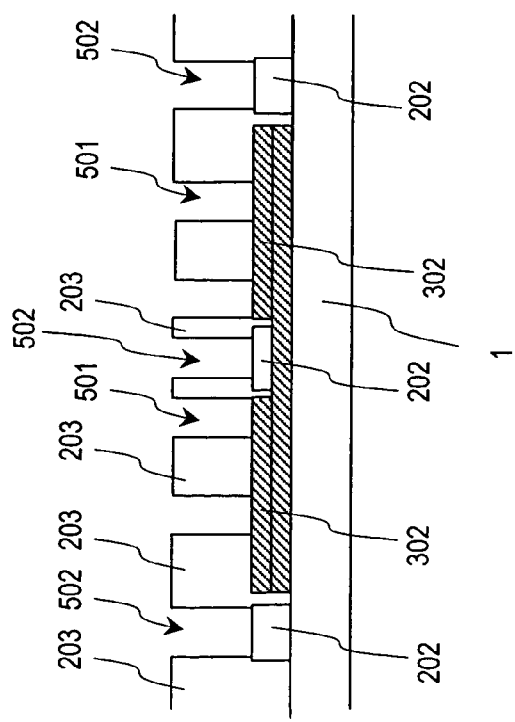

Next, FIGS. 13A and 13B are referred to. A third sacrificial layer 203 is formed on the structure shown in FIGS. 12A and 12B. The material of the third sacrificial layer 203 is, for example, a photo-sensitive organic material such as a photoresist or photo-sensitive polyimide. More preferably, the material of the third sacrificial layer 203 is a high viscosity type material which can provide a high aspect shape (e.g. SU-8 and SU-10 (both of which are trade names) available from MicroChem Inc.). However, a different material from that of the second sacrificial layer 202 is to be used as the material of the third sacrificial layer 203, in order to prevent the second sacrificial layer 202 from being removed during a subsequently-described step of removing portions of the third sacrificial layer 203.

Next, the third sacrificial layer 203 is subjected to exposure and development processes, thus forming throughholes 501 to 503. The throughholes 501 are used in order to form the first comb teeth 2a; the throughholes 502 are used in order to form the reinforcement ribs 9; and the throughhole 503 is used in order to form the center post 7.

Figure 14B:
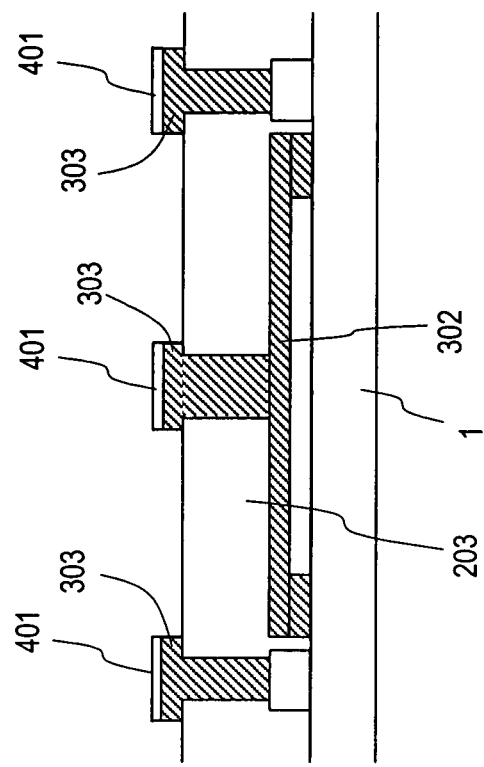
FIGS. 14A and 14B are schematic cross-sectional views illustrating a method for producing the microactuator according to Embodiment 5 of the present invention.
Figure 14A:
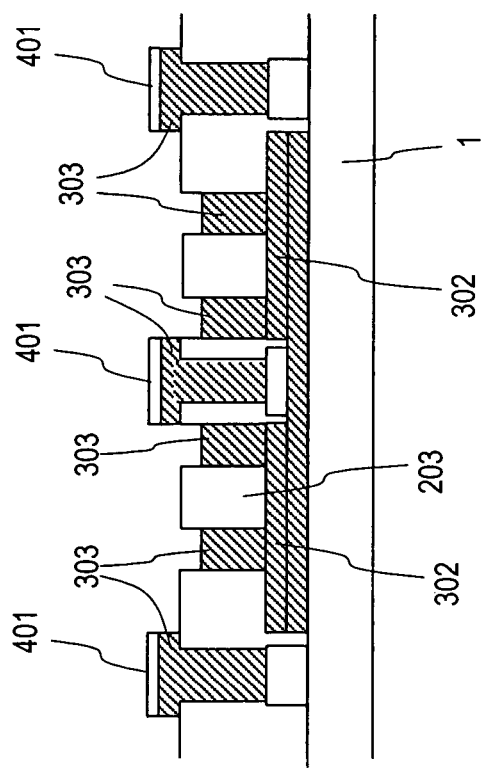

Next, FIGS. 14A and 14B are referred to. A third conductive layer 303 is formed from above the third sacrificial layer 203. Specifically, the third conductive layer 303 is embedded in the throughholes 501 to 503 to form protrusions as follows. The portions of the third conductive layer 303 embedded in the throughholes 501 are integrated with the second conductive layer 302, and form the comb teeth 2a. The portions of the third conductive layer 303 embedded in the throughholes 502 form the reinforcement ribs 9. The portion of the third conductive layer 303 embedded in the throughhole 503 is integrated with the second conductive layer 302, and forms the center post 7.

The material of the third conductive layer 303 is the same material (e.g. aluminum) as that of the second conductive layer 302, and the third conductive layer 303 is formed by low temperature sputtering. The sputtering is performed under a condition which, in order to fill the entire throughholes 501 to 503 with the above material, enables film formation to a uniform thickness on the side faces of the throughholes 501 to 503. Such a condition is disclosed in the following document, for example:

K. A. Shaw et al., "SCREAM I: a single mask, single-crystal silicon, reactive ion etching process for microelectromechanical structures", Sensors & Actuators A, 40, pp. 63-70 (1994).

Furthermore, in order to fill the entire throughholes 501 to 503 with the above material, the directions of the sputtered particles striking the base 1 from an Al target may be unified into a direction perpendicular to the base 1, by using a collimated sputtering technique or a long through sputtering technique.

Next, a first mask layer 401 is formed on the third conductive layer 303. The material of the first mask layer 401 is silicon oxide, for example. The first mask layer 401 is used as a mask when etching the third conductive layer 303. Therefore, the first mask layer 401 is eliminated from any region where the third conductive layer 303 is to be etched. Although the third conductive layer 303 may be etched by a wet etching technique, the present embodiment illustrates an example where the third conductive layer 303 is etched by a plasma etching technique employing a chlorine type gas. The etching condition is prescribed so that a large selection ratio is obtained between the third conductive layer 303 and the third sacrificial layer 203, so as to suppress etching of the third sacrificial layer 203.

FIGS. 14A and 14B show the third conductive layer 303 as etched. Since Al etching is performed from above the throughholes 501 with no first mask layer 401 being present on the throughholes 501, upper portions of the third conductive layer 303 embedded in the throughholes 501 are removed. In other words, the upper ends of the first comb teeth 2a are etched back to a position lower than the upper face of the third sacrificial layer 203. The height of the remaining first comb tooth 2a is, for example, about 10 to 20 (μm). Since Al etching is performed while leaving the first mask layer 401 above the throughholes 502 and 503, the third conductive layer 303 above the throughholes 502 and 503 (FIGS. 13A and 13B) is left intact without being removed.

After the Al etching, the first mask layer 401 is removed.

Figure 15A:
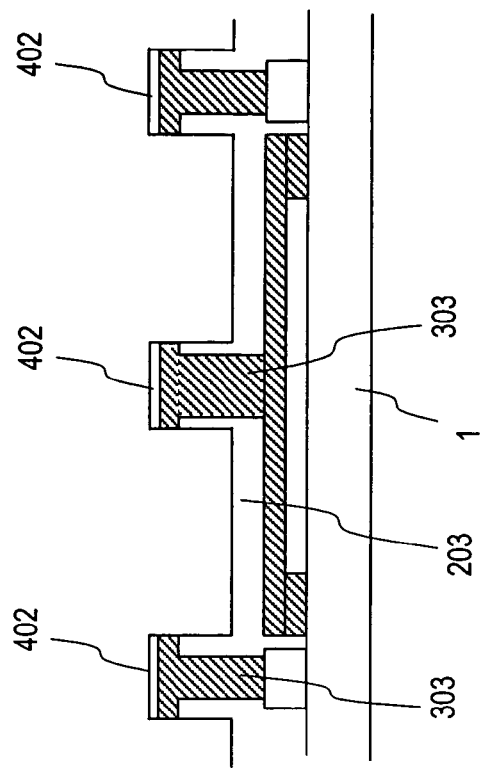
FIGS. 15A and 15B are schematic cross-sectional views illustrating a method for producing the microactuator according to Embodiment 5 of the present invention.
Figure 15B:
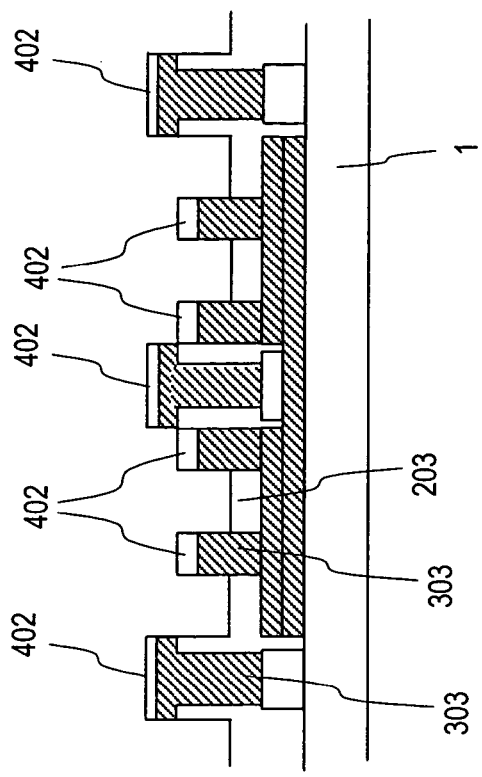

Next, FIGS. 15A and 15B are referred to. On the structure shown in FIGS. 14A and 14B, a second mask layer 402 is formed. The second mask layer 402 is provided in order to be used as a mask when etching the third sacrificial layer 203, and to form an interspace above the first comb teeth 2a in a subsequently-described step. The material of the second mask layer 402 may be e.g. silicon oxide, or alternatively, an organic material such as BCB (BenzoCycloButene), PAE (PolyAryleneEther), aromatic hydrocarbons, Parylene, or PTFE (PolyTetraFluoroEthylene).

The second mask layer 402 fills the interspace above the third conductive layer 303 within each throughhole 501 (as better shown in FIG. 14A). By removing the embedded second mask layer 402 in a subsequently-described step, the interspace above the first comb teeth 2a can be realized.

Next, a photoresist (not shown) is applied, and subjected to exposure and development processes, whereby the photoresist is partially removed so as to remain only in the regions above the portions of the third conductive layer 303 to become the reinforcement ribs 9 and the support posts 4 (i.e., above the throughholes 502 and 503). The remaining photoresist is used as a mask layer (not shown). In this state, the second mask layer 402 is etched for a predetermined period. Since the portions of the second mask layer 402 located above the first-comb teeth 2a have a large thickness, these portions of the second mask layer 402 remain with a predetermined thickness (e.g. about 2.0 to 10 (μm)). Any other portion of the second mask layer 402, i.e., except for these portions and except for the portions covered by the photoresist (not shown), is removed.

Next, the third sacrificial layer 203 is etched. In the case where the second mask layer 402 is made of silicon oxide, it is preferable to perform a dry etching using oxygen plasma. In the case where the second mask layer 402 is composed of an organic material which is different from the material of the third sacrificial layer 203, a wet etching using an organic solvent or the like may alternatively be performed. The regions of the third sacrificial layer 203 which are not protected by the second mask layer 402 are etched from above, so that their lower portions remain. The remaining lower portions of the third sacrificial layer 203 have a thickness of e.g. about 2.0 to 10 (μm).

Figure 16A:
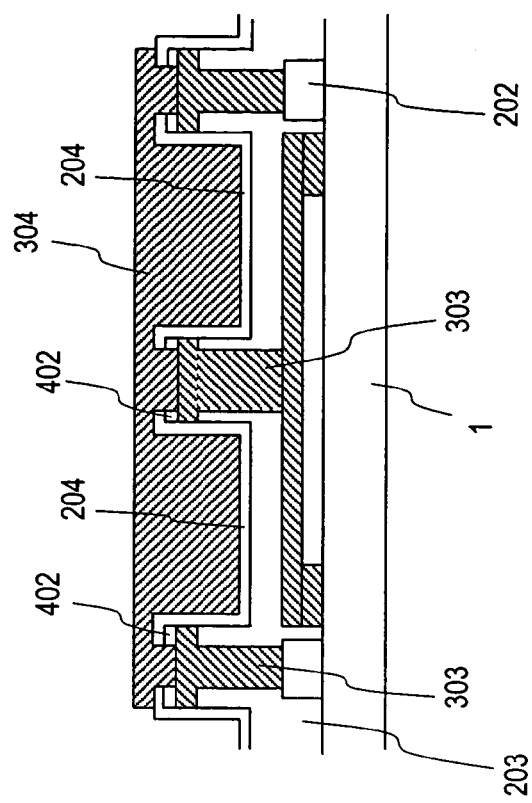
FIGS. 16A and 16B are schematic cross-sectional views illustrating a method for producing the microactuator according to Embodiment 5 of the present invention.
Figure 16B:
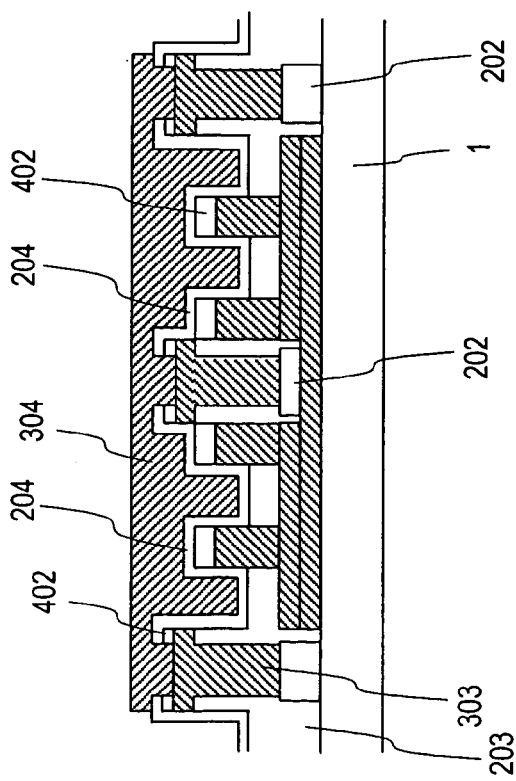

Next, FIGS. 16A and 16B are referred to. On the structure shown in FIGS. 15A and 15B, the fourth sacrificial layer 204 is formed to a substantially uniform film thickness. The material of the fourth sacrificial layer 204 is a photoresist or photo-sensitive polyimide. In order to form the fourth sacrificial layer 204 with a uniform thickness, it is preferable to use "PulseSpray" technique (registered trademark, available from Nordson) or a vapor deposition polymerization technique. The thickness of the fourth sacrificial layer 204 is e.g. about 0.5 to 1.0 (μm).

The fourth sacrificial layer 204 is subjected to exposure and development processes, whereby the fourth sacrificial layer 204 is removed from the regions above the portions of the third conductive layer 303 to become the reinforcement ribs 9 and the support posts 4 (i.e., above the throughholes 502 and 503). Next, through these regions, the second mask layer 402 is etched away so as to expose the third conductive layer 303.

Next, on the fourth sacrificial layer 204 and the exposed third conductive layer 303, a fourth conductive layer 304 is formed by low temperature sputtering. The material of the fourth conductive layer 304 is the same material (e.g. aluminum) as that of the third conductive layer 303. The fourth conductive layer 304 is to become the movable section 6.

Through a CMP (Chemical Mechanical Polishing) process, the fourth conductive layer 304 is planarized. The upper face of the fourth conductive layer 304 serves as the light reflecting surface 6a of the movable section 6. Next, any layer which is deposited around the reinforcement ribs 9 at the outer periphery of the movable section 6 (i.e., the regions between adjoining microactuators 100) is removed by a photolithography technique. Each individual movable section 6 has a length of e.g. about 100 to 200 (μm) along the horizontal direction.

Next, the movable section 6 (i.e., the fourth conductive layer 304) is released. The releasing is carried out in two steps. First, the first to fourth sacrificial layers 201 to 204 are removed by an oxygen plasma etching. Since the third sacrificial layer 203 has a large thickness, a flow path for the etchant can be easily obtained. Therefore, even in the case where the microactuator 100 has such an outer shape that its area is as large as 1600 μm$^2$ or more, these sacrificial layers can be removed without having to make upper holes for etching. Next, the second mask layer 402 is removed by using a hydrogen fluoride gas. As a result, the releasing of the movable section 6 is completed, and the microactuator 100 is accomplished, as shown in FIGS. 17A and 17B.

Since each reinforcement rib 9 is a sandwiched thin-film structure formed along the vertical direction within a throughhole, the residual stress within the reinforcement ribs 9 is small, so that the light reflecting surface 6a attains a very high planarity. Since it is possible to differentiate the height of the comb teeth 8a from the height of the reinforcement ribs 9 in the movable section 6, the comb teeth 8a and the reinforcement ribs 9 can be formed to their respective optimum heights depending on the electrostatic or rigidity requirement.

The first comb teeth 2a are connected to the root of the first comb electrode 2 via a minimum distance along the vertical direction, and the comb teeth 8a of the movable section 6 are connected to the lower face of the movable section 6 via a minimum distance along the vertical direction. Therefore, the comb teeth themselves are unlikely to be deformed, so that "pull-in" due to unwanted deformation of the comb teeth can be prevented even in the case where the intervals between the comb teeth are small.

By prescribing the thickness of the third and fourth sacrificial layers 203 and 204 and the thickness of the second mask layer 402 to desired thicknesses, the gaps between the comb teeth along the horizontal direction and the gaps between the comb teeth along the vertical direction can be prescribed to desired lengths. Thus, it is possible to simultaneously obtain an increased electrostatic force by decreasing the gaps along the horizontal direction and an increased movable stroke of the movable section 6 by increasing the gaps along the vertical direction.

Although the above embodiments illustrate examples where the movable section is shaped as a regular hexagon, the shape of the movable section is not limited thereto. For example, the movable section may be shaped as a rectangle (e.g., a square). The above-described effects can be obtained even with an oblong movable section whose aspect ratio is not 1:1.

The microactuator according to the present invention is suitably used in the fields of optical devices and optical disk apparatuses for performing aberration correction, optical scanning, spectroscopy, and the like. Also, the microactuator according to the present invention is suitably used in fields such as high-frequency circuits (e.g., tunable capacitors), flow control devices (e.g., variable flow paths), and biotechnology. The microactuator according to the present invention is useful as an actuator for rapidly changing a direction of light, and is particularly suitably used as a micromirror device for an micromirror array for aberration correction, where highly precisely planar light reflecting surfaces are required.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2004-129281 filed Apr. 26, 2004 and No. 2005-118473 filed Apr. 15, 2005, the entire contents of which are hereby incorporated by reference.

What is claimed is:

1. A microactuator comprising:
   a base;
   a first comb electrode supported by the base;
   a movable section having a second comb electrode opposing the first comb electrode, and at least one reinforcement rib protruding toward the base and extending along at least three directions in a plane of the movable section; and
   an elastic supporting member for supporting the movable section so as to allow the movable section to be displaced with respect to the base,
   wherein the first comb electrode includes a plurality of comb teeth and the second comb electrode includes a plurality of comb teeth;
   the height of the at least one reinforcement rib is greater than the height of the plurality of comb teeth of the second comb electrode; and
   a groove in the first comb electrode that opposes the reinforcement rib has a bottom which is lower than a foot of at least one of the comb teeth of the first comb electrode.

2. The microactuator of claim 1, wherein,
   a thickness of the at least one reinforcement rib is greater than a thickness of each of the plurality of comb teeth of the second comb electrode.

3. The microactuator of claim 1, wherein,
   the plurality of comb teeth of the second comb electrode extend in a direction from an inside to an outside of the movable section.

4. The microactuator of claim 1, wherein,
   the plurality of comb teeth of the second comb electrode are shaped as concentric circles.

5. The microactuator of claim 1, wherein the at least one reinforcement rib is provided at an outer periphery of the movable section.

6. The microactuator of claim 1, wherein,
   the plurality of comb teeth of the second comb electrode and the at least one reinforcement rib extend in a same direction.

7. The microactuator of claim 1, wherein,
the plurality of comb teeth of the second comb electrode extend in a direction perpendicular to a direction in which the at least one reinforcement rib extends.

8. The microactuator of claim 1, wherein the height of the second comb electrode reduces in a direction from an inside to an outside of the movable section.

9. The microactuator of claim 1, wherein,
each of the plurality of comb teeth of the second comb electrode has a thickness which reduces in a direction from an inside to an outside of the movable section.

10. The microactuator of claim 1, wherein the elastic supporting member supports the movable section so as to allow the movable section to have a bi-axial tilt with respect to the base.

11. The microactuator of claim 1, wherein the elastic supporting member supports the movable section so as to allow the movable section to be displaced along a vertical direction with respect to the base and have a bi-axial tilt with respect to the base.

12. The microactuator of claim 1, wherein the movable section includes a light reflecting surface.

13. The microactuator of claim 1, wherein the at least one reinforcement rib extends radially from a central portion of the movable section.

* * * * *